United States Patent
Mather et al.

(10) Patent No.: US 11,800,810 B2
(45) Date of Patent: Oct. 24, 2023

(54) MAGNETIC FIELD SENSOR WITH FLUX GUIDE RESET

(71) Applicant: Robert Bosch GmbH, Stuttgart (DE)

(72) Inventors: Phillip Mather, Phoenix, AZ (US); Cheng-Han Yang, Campbell, CA (US)

(73) Assignee: Robert Bosch GmbH, Stuttgart (DE)

(*) Notice: Subject to any disclaimer, the term of this patent is extended or adjusted under 35 U.S.C. 154(b) by 373 days.

(21) Appl. No.: 17/104,281

(22) Filed: Nov. 25, 2020

(65) Prior Publication Data
US 2022/0165941 A1    May 26, 2022

(51) Int. Cl.
| | |
|---|---|
| *H10N 50/01* | (2023.01) |
| *G01R 33/00* | (2006.01) |
| *H10B 61/00* | (2023.01) |
| *H10N 59/00* | (2023.01) |
| *G01R 33/09* | (2006.01) |

(52) U.S. Cl.
CPC ......... *H10N 50/01* (2023.02); *G01R 33/0052* (2013.01); *G01R 33/093* (2013.01); *G01R 33/096* (2013.01); *G01R 33/098* (2013.01); *H10B 61/00* (2023.02); *H10N 59/00* (2023.02)

(58) Field of Classification Search
CPC ... H01L 43/12; H01L 27/22; H01L 27/11502; H01L 27/11585; H01L 28/55; H01L 29/40111; H01L 29/516; H01L 29/6684; H01L 29/78391; H01L 43/00; H01L 2924/1441; G01R 33/0052; G01R 33/093; G01R 33/096; G01R 33/098
USPC .......................................................... 438/3
See application file for complete search history.

(56) References Cited

U.S. PATENT DOCUMENTS

| | | | |
|---|---|---|---|
| 9,720,051 B2 | 8/2017 | Holm et al. | |
| 9,910,106 B2 | 3/2018 | Mather et al. | |
| 2003/0111626 A1* | 6/2003 | Hosotani | H01L 27/228 257/E27.005 |
| 2006/0138576 A1* | 6/2006 | Galdis | G11C 11/16 257/E27.005 |
| 2007/0246832 A1* | 10/2007 | Odagawa | H01L 45/1625 257/763 |
| 2007/0253122 A1* | 11/2007 | Fukuzawa | B82Y 25/00 360/324.11 |
| 2013/0058161 A1* | 3/2013 | Yamanaka | G01R 33/0011 324/244 |
| 2014/0159717 A1* | 6/2014 | Paci | G01R 33/0011 324/244 |

(Continued)

*Primary Examiner* — Suberr L Chi
(74) *Attorney, Agent, or Firm* — Kathy Takeguchi

(57) ABSTRACT

A magnetic field sensor structure includes a magnetoresistive sensor assembly and a transistor assembly. A dielectric layer is deposited on the transistor assembly. The dielectric layer includes a trench that exposes an interconnect of the transistor assembly. A damascene process is performed to form an ultra-thick metal (UTM) layer within the trench to create a first metal coil. The first metal coil is configured as a first reset component. Another dielectric layer is formed on the first metal coil. A flux guide is formed within the another dielectric layer. A second metal coil is formed over the another dielectric layer. The second metal coil is configured as a second reset component. The first reset component and the second reset component are configured as a reset mechanism, which is responsive to the transistor assembly and operable to magnetize the flux guide to a predetermined orientation.

16 Claims, 11 Drawing Sheets

(56) References Cited

U.S. PATENT DOCUMENTS

| | | | |
|---|---|---|---|
| 2015/0192655 A1* | 7/2015 | Liu | G01R 33/0011 |
| | | | 324/244 |
| 2015/0346290 A1* | 12/2015 | Holm | G01R 33/09 |
| | | | 324/202 |
| 2019/0221739 A1* | 7/2019 | Kim | H01L 45/085 |
| 2020/0319265 A1* | 10/2020 | Gider | G01R 33/0206 |
| 2020/0343265 A1* | 10/2020 | Chang | G01R 33/0206 |
| 2020/0371171 A1 | 11/2020 | Mohan et al. | |
| 2021/0375890 A1* | 12/2021 | Chia | G01R 33/09 |
| | | | 324/202 |

* cited by examiner

MAGNETIC FIELD SENSOR WITH FLUX GUIDE RESET

FIELD

This disclosure relates generally to sensors, and more specifically to magnetic field sensors.

BACKGROUND

A sensor device may include magnetoresistive sensors, which are configured to detect in-plane magnetic fields. In addition, the sensor device includes a flux guide to guide an out-of-plane field, such as the z-axis field, into an xy-plane to be sensed by an in-plane magnetoresistive sensor. The flux guide has a preferred magnetization orientation for optimal z-axis response. The preferred magnetization orientation may be disturbed, for example, by exposure to a very large external magnetic field, which may introduce magnetic domain walls in the flux guide. This may result in a lower signal to noise ratio (SNR) and a shift in the offset reading of the magnetoresistive sensor. The uniform magnetization of the flux guide can be reset by a reset operation. However, such reset operations typically rely on large operating currents, thereby being reliant on relatively large voltage overhead and/or significant power consumption. The relatively large operating requirements tend to make the sensor devices with flux guide reset mechanisms unsuitable for mobile and smart phone applications.

SUMMARY

The following is a summary of certain embodiments described in detail below. The described aspects are presented merely to provide the reader with a brief summary of these certain embodiments and the description of these aspects is not intended to limit the scope of this disclosure. Indeed, this disclosure may encompass a variety of aspects that may not be explicitly set forth below.

According to at least one aspect, a method relates to fabricating a sensor device that is enabled to magnetize or demagnetize a flux guide to a predetermined magnetic orientation. The method includes depositing a dielectric layer on a transistor assembly. The method includes forming a first trench in the dielectric layer. The first trench at least partially exposes a first interconnect that is connected to the transistor assembly. The method includes depositing a diffusion barrier layer on at least sidewalls of the dielectric layer that define the first trench. The method includes forming an ultra thick metal (UTM) layer on the diffusion barrier layer to fabricate a first metal coil within the first trench. The method includes depositing another dielectric layer on the first metal coil. The method includes forming a flux guide in the another dielectric layer. The method includes forming a metal line in the another dielectric layer after the flux guide is formed. The method includes forming a second metal coil over the another dielectric layer. The second metal coil may be connected to the metal line. The first metal coil and the second metal coil are configured as a reset mechanism that is configured to be responsive to the transistor assembly to magnetize or demagnetize the flux guide to the predetermined magnetic orientation.

According to at least one aspect, a method relates to integrating a magnetoresistive sensor assembly with a transistor assembly on a chip. The method includes forming the transistor assembly on a substrate. The transistor assembly includes at least a semiconductor device and a first interconnect. The first interconnect is operably connected to the semiconductor device. The method includes depositing a dielectric layer on the transistor assembly. The method includes removing portions of the dielectric layer to form a first trench that at least partially exposes the first interconnect. The method includes performing a damascene process to form a UTM layer within the first trench to create a first metal coil. The first metal coil is configured as a first reset component. The method includes depositing another dielectric layer on the first metal coil. The method includes forming a flux guide within the another dielectric layer. The method includes forming a second metal coil on the another dielectric layer. The second metal coil is configured as a second reset component. The first reset component and the second reset component are configured as a reset mechanism. The reset mechanism is configured to be responsive to the transistor assembly. The reset mechanism is configured to be operable to magnetize or demagnetize the flux guide to a predetermined magnetic orientation.

According to at least one aspect, a method relates to fabricating a sensor structure that includes a CMOS device and a magnetoresistive sensor device with a reset operation for a flux guide. The method includes depositing a dielectric layer on the CMOS device. The method includes forming a first trench in the dielectric layer. The first trench comprises a coil shape in the dielectric layer in plan view. The method includes forming a UTM layer within the first trench of the dielectric layer to fabricate a first metal coil. The UTM layer may be formed via bather seed deposition followed by electroplating, deposition, or any other suitable method. The first metal coil is configured as a first reset component. The method includes depositing another dielectric layer on the first metal coil. The method includes forming the flux guide along at least sidewall portions of the another dielectric layer. The method includes forming a second metal coil on the another dielectric layer such that the flux guide is between the first metal coil and the second metal coil. The second metal coil may be operably connected to the first metal coil. The second metal coil is configured as a second reset component. The first reset component and the second reset component are configured as a reset mechanism. The reset mechanism is configured to perform the reset operation to orient the flux guide to a predetermined magnetic orientation using voltage that is less than 5 volts.

These and other features, aspects, and advantages of the present invention are discussed in the following detailed description in accordance with the accompanying drawings throughout which like characters represent similar or like parts.

DETAILED DESCRIPTION

The embodiments described herein, which have been shown and described by way of example, and many of their advantages will be understood by the foregoing description, and it will be apparent that various changes can be made in the form, construction, and arrangement of the components without departing from the disclosed subject matter or without sacrificing one or more of its advantages. Indeed, the described forms of these embodiments are merely explanatory. The illustrations provide conceptual visualizations, which may or may not be drawn to scale. These embodiments are susceptible to various modifications and alternative forms, and the following claims are intended to encompass and include such changes and not be limited to the particular forms disclosed, but rather to cover all modifications, equivalents, and alternatives falling with the spirit and scope of this disclosure.

In general, magnetoresistive sensors are used in a full Wheatstone bridge configuration, where all four legs 178, 180, 182, and 184 of the bridge have the same resistance and react to an external field. For example, the magnetoresistive sensors may include anisotropic magnetoresistance (AMR), giant magnetoresistance (GMR), tunnel magnetoresistance (TMR), or any suitable magnetoresistive technology. In the presence of an external field along the sensitive direction, the resistance of two bridge legs increases, while the resistance of the other two bridge legs decreases to create a differential output voltage proportional to the applied field. In alternative embodiments, one or two of the bridge legs may change with respect to the applied magnetic field while the other two bridge legs stay fixed or increase at a lower rate of increase. For example, this is achieved in a Z-axis sensor by positioning the flux guides asymmetrically around tunneling magnetoresistance (TMR) sensing elements to result in a net differential output voltage in the presence of ambient Z-axis field.

Figure 1:
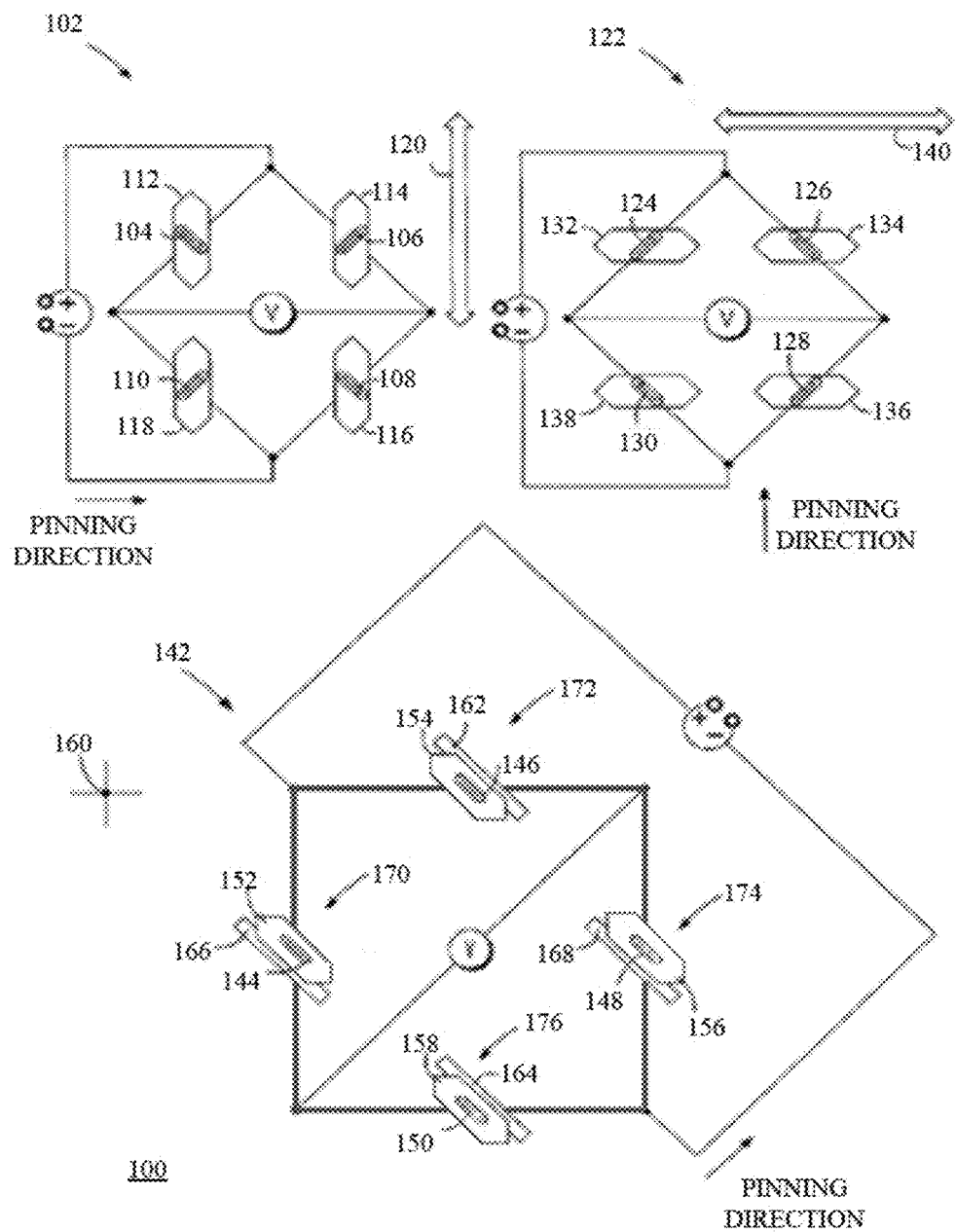
FIG. 1 is a diagram of an example of a magnetic field sensor that includes three differential sensors in which each differential sensor is formed with sensing elements that are connected in a Wheatstone bridge configuration according to an example embodiment of this disclosure.

FIG. 1 shows a schematic diagram of an example of a magnetoresistive (MR) sensor 100. The MR sensor includes a first differential sensor 102, a second differential sensor 122, and a third differential sensor 142 for detecting the component directions of an applied field along a first axis 120 (e.g., the y-axis direction), a second axis 140 (e.g., the x-axis direction), and a third axis 160 (e.g., the z-axis direction), respectively. Each of the first differential sensor 102, the second differential sensor 122, and the third differential sensor 142 is formed with unshielded sensing elements that are connected in a Wheatstone bridge configuration. Thus, the first differential sensor 102 is formed from the connection of a plurality of sensing elements 104, 106, 108, 110 in a bridge configuration over a corresponding plurality of pinned layers 112, 114, 116, 118, where each of the pinned layers 112-118 is magnetized in the x-axis direction. In similar fashion, the second differential sensor 122 is formed from the connection of a plurality of sensing elements 124, 126, 128, 130 in a bridge configuration over a corresponding plurality of pinned layers 132, 134, 136, 138 that are each magnetized in the y-axis direction that is perpendicular to the magnetization direction of the pinned layers 112, 114, 116, and 118.

Also, the third differential sensor 142 is in the same plane as the first sensor 102 and the second sensor 122. The third differential sensor 142 is formed from the connection of a plurality of sensing elements 144, 146, 148, 150 in a bridge configuration over a corresponding plurality of pinned layers 152, 154, 156, 158 that are each magnetized along an in-plane direction. In this third bridge configuration, the sensing elements 144, 146, 148, and 150 all have an easy axis magnetization direction that is orthogonal to the pinned magnetization direction of the pinned layers 152, 154, 156, 158. The third bridge configuration further includes flux guides 162 and 164, which are positioned adjacent to the right edge of sensing elements 146 and 150, and flux guides 166 and 168, which are positioned adjacent to the left edge of sensing elements 144 and 148, respectively. Flux guides 166, 162, 168, and 164 are positioned below the sensing elements 144, 146, 148, and 150.

By positioning the first differential sensor 102 and the second differential sensor 122 to be orthogonally aligned, each with the sensing element orientations deflected equally from that sensor's pinning direction and orthogonal to one another in each sensor, the sensors can detect the component directions of an applied field along the first axis (y axis) and second axis (x axis). Flux guides 162 and 166 are positioned in the differential sensor 142 below the opposite edges of the elements 146 and 144, in an asymmetrical manner between the leg 172 and the leg 170. The flux guide 162 of sensing element 146 guides the magnetic flux from the Z-field into the in-plane along the right side and causes the magnetization of sensing element 146 to rotate in a first direction towards a higher resistance. Similarly, the magnetic flux from the Z-field may be guided by the flux guide 166 into the in-plane along the left side of the sensing element 144 and cause the magnetization of sensing element 144 to rotate in a second direction, which is opposite from the first direction towards a lower resistance as this guide is antisymmetric to guide 162. Also, flux guides 164 and 168 are positioned in differential sensor 142 below the opposite edges of the elements 150 and 148, in an asymmetrical manner between the leg 176 and the leg 174. The flux guide 164 of sensing element 150 guides the magnetic flux from the Z-field into the in-plane along the right side and causes the magnetization of sensing element 150 to rotate in a first direction towards a higher resistance. Similarly, the magnetic flux from the Z-field may be guided by the flux guide 168 into the in-plane along the left side of the sensing element 148 and cause the magnetization of sensing element 148 to rotate in a second direction, which is opposite from the first direction towards a lower resistance as this guide is antisymmetric to guide 164. Thus, the differential sensor 142 can detect the component directions of an applied field along the third axis or the vertical axis (z axis).

Figure 2:
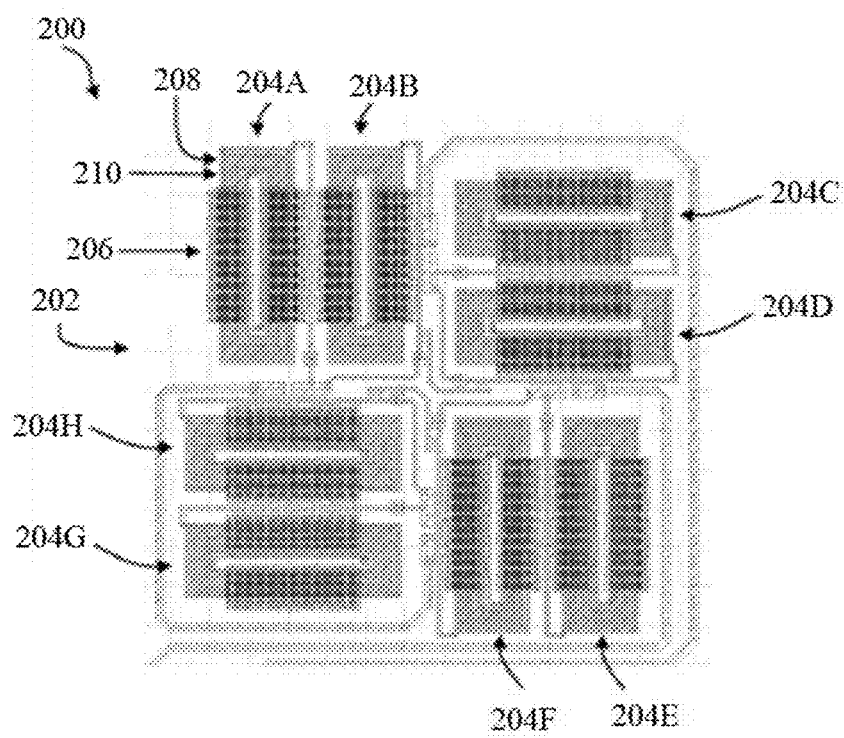
FIG. 2 is a diagram of a top view of a magnetic field sensor with an arrangement of sub-blocks that form a Z-sensor in which each sub-block includes a reset mechanism according to an example embodiment of this disclosure.

FIG. 2 depicts a conceptual diagram of a portion of the TMR sensor device 200. The TMR sensor device 200 includes first, second, and third differential sensors configured to detect the component directions of an applied field along a first axis (y axis), a second axis (x axis), and a third axis (z axis), respectively, similar to how the differential sensors 102, 122, 142 of FIG. 1 detect the component directions of an applied field. More specifically, FIG. 2 illustrates a planar view of a portion of the third differential sensor 202 (Z-sensor 202) of the TMR device 200. This Z-sensor 202 is configured to detect the component direction of the applied magnetic field along the third axis or z-axis direction.

In the example shown in FIG. 2, the Z-sensor 202 includes eight sub-blocks 204A~204H in which each one of the sub-blocks 204A~204H includes a sensor array 206 with sensing elements and flux guides, an independent flux guide reset coil 208, and an independent sensing element reset coil 210. The independent flux guide reset coil 208 and the independent sensing element reset coil 210 of each of the sub-blocks 204A~204H enable the sub-blocks 204A~204H to be reset independently from one another between read cycles of the Z-sensor 202. As an illustrative example, the flux guide reset coil 208, and the sensing element reset coil 210 of sub-block 204C enable the respective sensing elements and flux guides of sub-block 204C to be reset independently from the respective sensing elements and flux guides of the other sub-blocks 204A~204B and 204D~204H. In this regard, the sensing elements and the flux guides of sub-blocks 204A~204B and 204D~204H are not reset when the sensing elements and the flux guides of sub-block 204C are reset. As another illustrative example, the flux guide reset coil 208 and the sensing element reset coil 210 enable the respective sensing elements and flux guides of sub-blocks 204A, 204C, 204E, and 204H to be reset independently while the respective sensing elements and flux guides of sub-blocks 204B, 204D, 204F, and 204G are not reset.

The positional relationship among the sensor array 206, the flux guide reset coil 208, and the sensing element reset coil 210 of each one of the sub-blocks 204A~204H is generally similar from sub-block to sub-block and defines an orientation of the sub-block. As shown in FIG. 2, the eight sub-blocks 204A~204H are laid out in horizontal and vertical orientations relative to one another. For example, sub-blocks 204A-204B and 204E-204F have vertical orientations relative to the viewing direction of FIG. 2 while sub-blocks 204C-204D and 204G-204H have horizontal orientations relative to the viewing direction of FIG. 2. The different sub-block orientations mitigate the effects of stress and temperature on the performance of the Z-sensor 202 because these effects in the anisotropy directions are averaged together.

The flux guide reset coil 208 in the embodiment depicted in FIG. 2 is a planar coil that has an outermost coil portion, an innermost coil portion, and a plurality of interior turns disposed between the outermost and innermost coil portions. The planar coil has a start segment that extends linearly for a long-side length, then a first coil segment that is oriented at a predetermined angle (e.g., 45 degrees, 90 degrees, etc.) or a suitable shape (e.g., arc) from the start segment and extends linearly for a short-side length, and then a second coil segment that is oriented at a predetermined angle (e.g., 45 degrees, 90 degrees, etc.) or a suitable shape (e.g., arc) from the first coil segment and extends linearly for another long-side length. This pattern continues with the long-side and short-side lengths getting shorter after each successive turn about a winding axis to define the coil. The long-side lengths are structured to overlap the tunnel junctions (TJs) and the flux guides 312.

The sensing element reset coil 210 is provided as a separate metal layer overlaying the flux guide reset coil 208 and the sensor array 206. The sensing element reset coil 210 is arranged substantially in a plane that is spaced apart from the plane in which the flux guide reset coil 208 is arranged, and the sensing element reset coil 210 is electrically insulated from the flux guide reset coil 208. The sensing element reset coil 210 is positioned relative to the sensor array 206 in such a way that it can perform the sense element reset operation as well as add to the total reset field during the flux guide reset operation with the flux guide reset coil 208. The sensor array 206 is disposed between the sensing element reset coil 210 and the flux guide reset coil 208 such that one of these two coils is positioned above the sensor array 206 while the other one of these two coils is positioned below the sensor array 206.

The Z-sensor 202 further includes circuitry, which is operatively connected to each of the flux guide reset coil 208 and the sensing element reset coil 210. This circuitry includes structures, devices, or technology configured to make and/or break electrical connections and/or deliver voltage and/or current to/from/between one or more conductive elements for which the circuitry is operatively associated or connected. The circuitry of the Z-sensor 202 is specifically configured to execute the flux guide reset operation and the sense element reset operation independently from one another within each one of the sub-blocks 204A-204H and independently among the different sub-blocks 204A-204H.

To carry out the flux guide reset operation, the circuitry is configured to energize both the flux guide reset coil 208 and the sensing element reset coil 210 to generate the first reset field about the flux guide reset coil 208 and the second reset field about the sensing element reset coil 210, respectively. The first and second reset fields combine to establish a total reset field sufficient to orient the magnetization of a set of flux guides into a known, previously-calibrated state, which can be interchangeably referred to as the predetermined magnetization direction/orientation of the set of flux guides or the predetermined flux guide magnetization direction/ orientation. In another embodiment for carrying out the flux guide reset operation, the circuitry is further configured to energize a flux guide assist coil to generate a third reset field about the flux guide assist coil. The third reset field is configured to smooth the first reset field near the flux guides, which facilitates in orienting or reorienting the magnetization of the flux guides during the flux guide reset operation.

Figure 3:
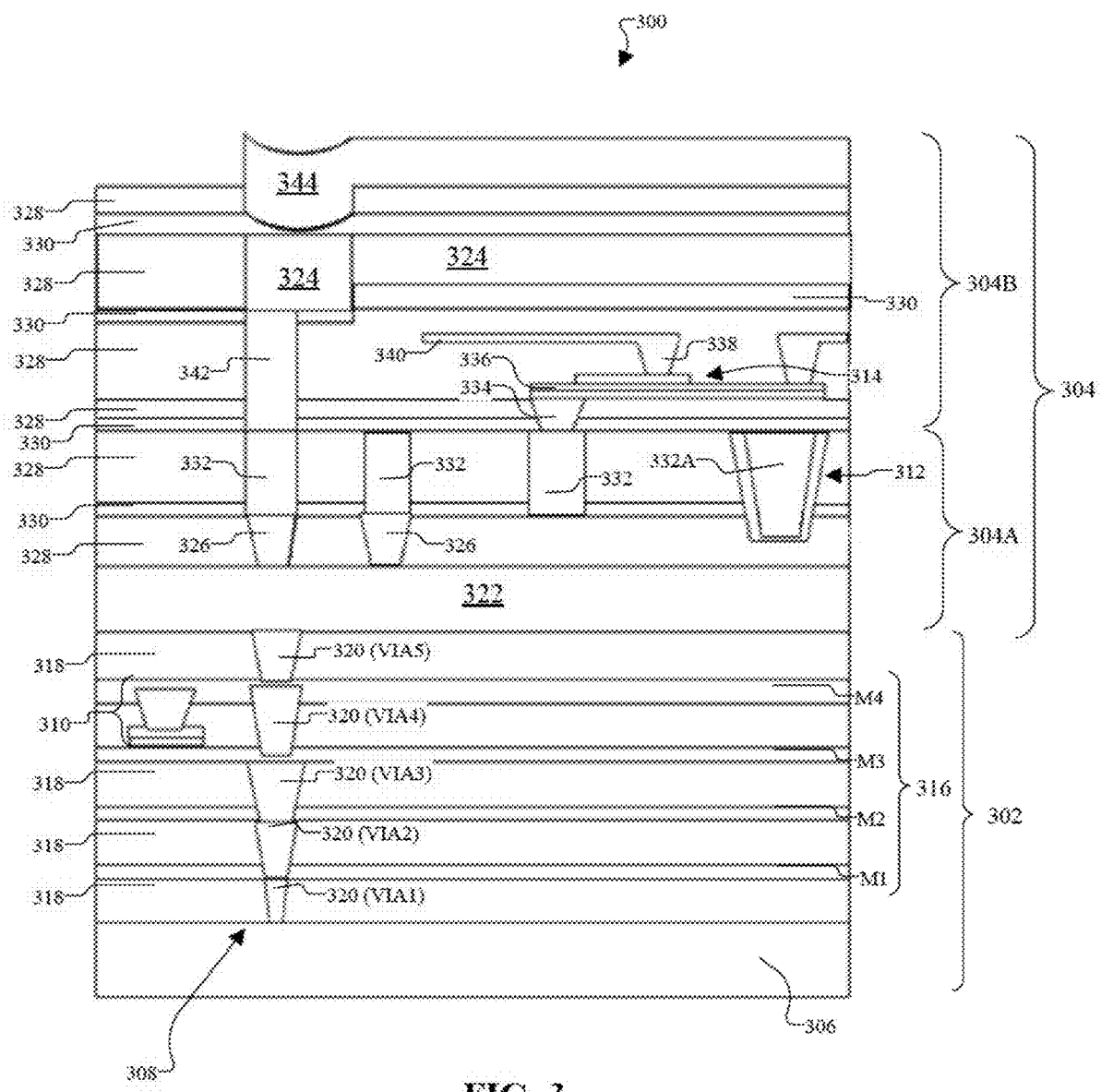
FIG. 3 is a diagram of a view of one cross-section of an example of a stack structure of a part of a sensor structure according to an example embodiment of this disclosure.

FIG. 3 is a view of a cross-section that shows a part of a sensor structure 300 according to an example embodiment. The sensor structure 300 integrates transistor technology with magnetoresistance technology, such as tunneling magnetoresistance (TMR) technology, on a single chip. In FIG. 3, for instance, the sensor structure 300 includes a transistor assembly 302 and a magnetoresistive sensor assembly 304 arranged in a stack with respect to a substrate 306. The transistor assembly 302 and the magnetoresistive sensor assembly 304 are operably connected to each other.

The transistor assembly 302 includes at least a complementary metal-oxide-semiconductor (CMOS) device 308. The transistor assembly 302 may include at least one metal-insulator-metal (MIM) device 310 or a magneto resistive device. For example, in FIG. 3, the transistor assembly 302 includes at least circuitry, which is configured to activate a flux guide reset mechanism of the magnetoresistive sensor assembly 304 to establish a total reset field sufficient to orient the magnetization of at least one flux guide 312 into a known, previously-calibrated state. Although not shown in the cross-sectional view of FIG. 3, the CMOS device 308 includes at least standard CMOS components. The CMOS device 308 is configured as the circuitry, as discussed with respect to the Z-sensor 202 of FIG. 2. In this regard, the CMOS device is operable to control at least a reset operation to energize the flux guide reset mechanism to set a flux guide 312 into a predetermined state. In addition, the CMOS device 308 is operable to control at least a reset operation to a sensing element 314, such as a TMR device. Also, the transistor assembly 302 and/or CMOS device 308 includes one or more metal layers 316. As a non-limiting example, in FIG. 3, the transistor assembly 302 includes at least a first metal layer M1, a second metal layer M2, a third metal layer M3, and a fourth metal layer M4. The plurality of metal layers 316 are disposed in an alternating configuration with a plurality of insulating layers 318, as shown in at least FIG. 3. The plurality of insulating layers 318 are provided with a plurality of vertical interconnects 320, which operably connect the plurality of metal layers 316 and the CMOS device 308 to each other. The plurality of vertical interconnects 320 includes any suitable number of vertical interconnects 320. For example, in FIG. 3, the plurality of vertical interconnects 320 includes at least a first vertical interconnect VIA1, a second vertical interconnect VIA2, a third vertical interconnect VIA3, a fourth vertical interconnect VIA4, and a fifth vertical interconnect VIA5. Referring to FIG. 3, as an example, the upper metal layer (e.g., fourth metal layer M4) is configured to connect to the magnetoresistive sensor assembly 304 via the upper vertical interconnect 320 (e.g. VIA5). In addition, within the insulating portion of the metal layers 316, the MIM device 310 is provided in the vicinity of at least one of the metal layers 316. In FIG. 3, for instance, the MIM device 310 is a capacitor top metal (CTM) device disposed in an insulating portion between the third metal layer M3 and the fourth metal layer M4. In this regard, the MIM device 310 is operably connected to the CMOS device 308 via the metal layers 316 and the vertical interconnects 320.

The magnetoresistive sensor assembly 304 includes at least the TMR device, which is configured as the Z-sensor 202. For example, FIG. 3 illustrates a conceptual diagram of a cross-sectional view of a portion of the TMR device, which includes at least a sensing element 314, which corresponds to at least one of the sensing elements of the sensor array 206 of FIG. 2. The TMR device is configured to detect the component direction of the applied magnetic field along the third axis or z-axis direction. In addition, the TMR device includes the flux guide 312 and a flux guide reset mechanism. In this example, the flux guide reset mechanism includes at least a first reset component and a second reset component. The first reset component includes at least a section of an ultra-thick metal (UTM) coil 322, which is configured as the flux guide reset coil 208 (FIG. 2) and which is configured as at least one coil with respect to a top, planar view. The second reset component includes at least a section of an upper metal interconnect element 324, which is configured as the sensing element reset coil 210 (FIG. 2) and which is configured as at least one coil with respect to a top, planar view. In this example, the upper metal interconnect element 324 includes at least one coil or any suitable number of coils. In addition, the flux guide reset mechanism may include at least one other reset component (not shown), such as the flux guide assist coil that was discussed earlier. As shown in at least FIG. 3, the flux guide 312 is disposed between the first reset mechanism (e.g., UTM coil 322) and the second reset mechanism (e.g., upper metal interconnect element 324).

In response to communications with the transistor assembly 302, the flux guide reset mechanism is configured to carry out a reset operation in which the first reset component and the second reset component are both activated to reset the flux guide 312 to a predetermined magnetic orientation or a default setting. More specifically, the reset mechanism is advantageously configured to perform the reset operation using voltage that is less than 5 volts, thereby being suitable for a variety of applications including, for example, mobile and smart phone applications. For instance, in the illustrated embodiment, the flux guide reset mechanism is configured to perform the reset operation using voltage that is around 3 volts but less than 3.5 volts.

The magnetoresistive sensor assembly 304 includes vertical interconnects 326 that are disposed within a dielectric layer 328, which is disposed on the UTM coil 322. The vertical interconnects 326 operably connect the UTM coil 322 to a metal line 332. In FIG. 3, the metal line 332 comprises copper. The metal line 332 is connected to a magnetic tunnel junction (MTJ) element by means of the vertical interconnect 334. The MTJ element includes a magnetic reference element 336 (or pinning element 336) and the sensing element 314. The sensing element 314 provides a change in resistance in response to a field. The MTJ element is connected to a magnetic local interconnect (MLI) 340 by means of vertical interconnect 338. In addition, the upper metal interconnect element 324 is connected to the metal line 332 by means of vertical interconnect 342. The metal pads 344 comprise aluminum, tantaulum, copper, any suitable metal, or any suitable combination thereof. Furthermore, the sensor structure 300 includes a number of dielectric layers 328 and etch stop layers 330 of suitable thicknesses between these various components, as shown in FIG. 3.

Figure 4:
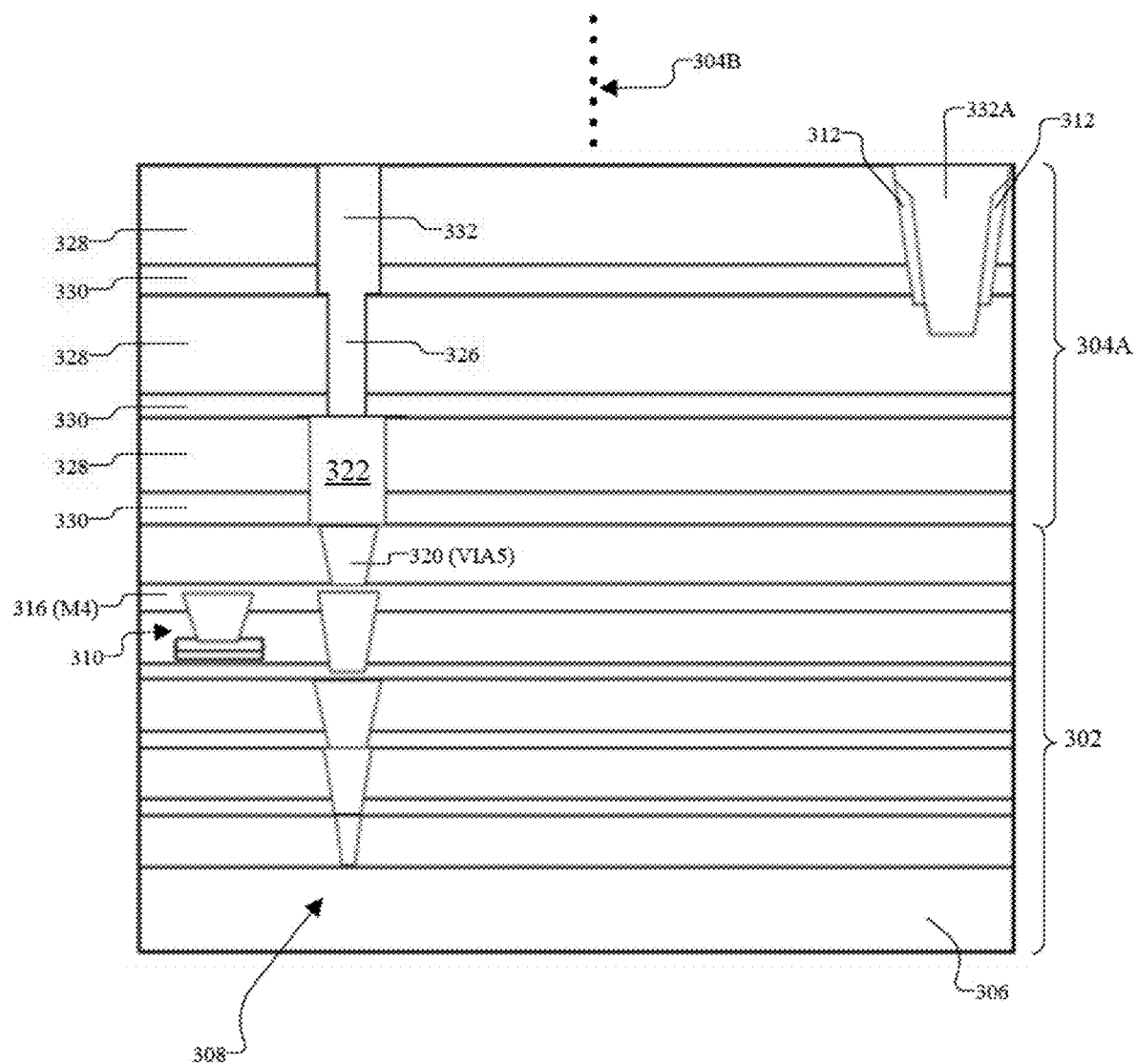
FIG. 4 is a diagram of an example of a view of another cross-section of a portion of the stack structure of FIG. 3 according to an example embodiment of this disclosure.

FIG. 4 provides another view of another cross-section that shows a selected portion of the sensor structure 300 of FIG. 3. In contrast to FIG. 3 that shows a cross-section of a part of the sensor structure 300 that is taken with respect to a lengthwise dimension of the UTM coil 322, FIG. 4 shows a cross-section of a selected portion of the stack structure of the sensor structure 300 that is taken with respect to a widthwise dimension of the UTM coil 322. More specifically, FIG. 4 shows that portion of the stack structure that relates to the integration of the transistor assembly 302 with the magnetoresistive assembly 304 that provides an improved reset operation for the flux guide 312, as well as greater design options (e.g., routing options) for the remaining parts of the sensor structure 300 by being compact along the vertical axis (e.g., thickness direction), and including damascene technology for finer in plane routing capabilities.

Figure 5:
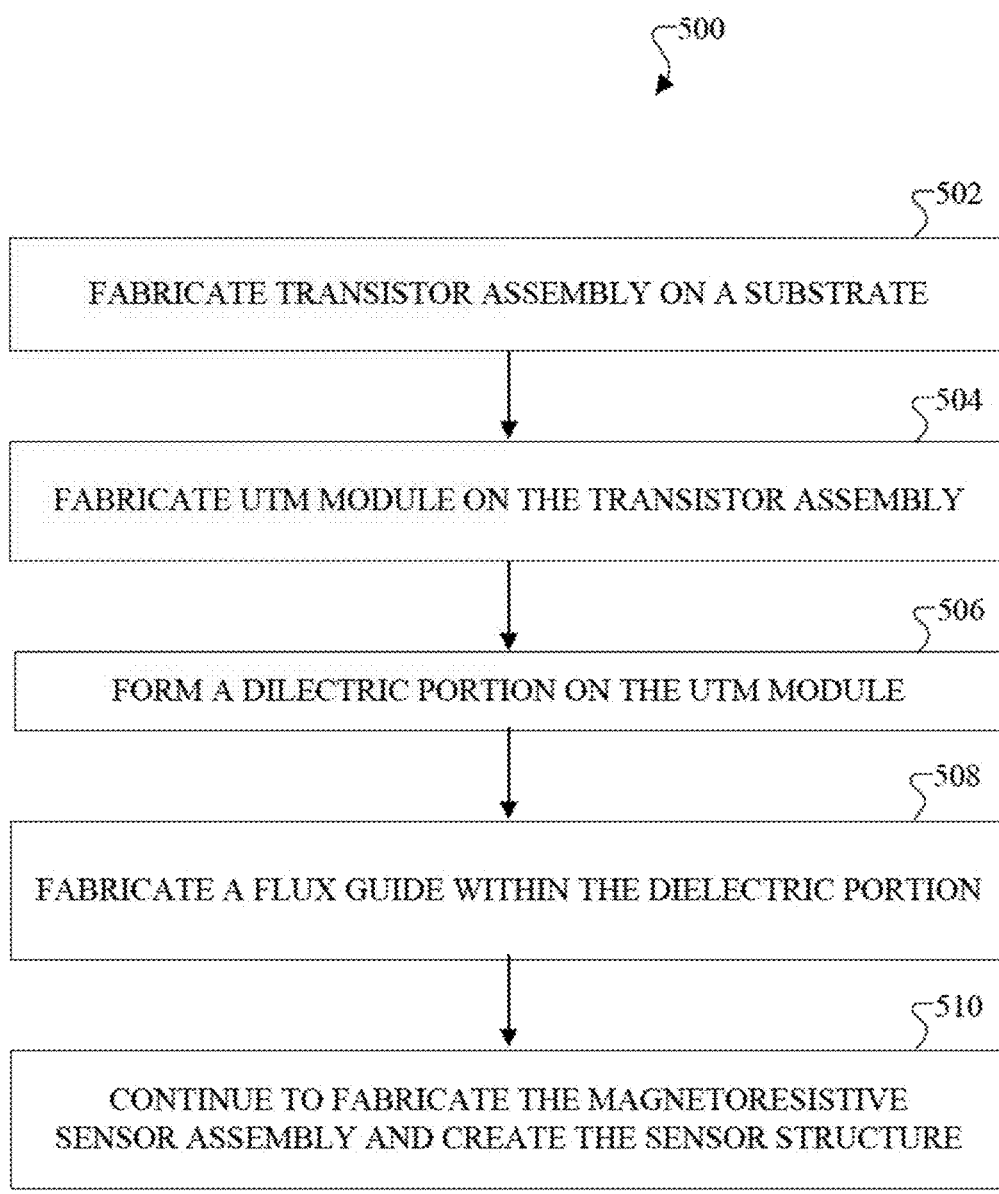
FIG. 5 is a flow chart of an example of a method for fabricating a sensor structure that includes an integration process that forms that portion of the stack structure that is shown in FIG. 4 according to an example embodiment of this disclosure.

FIGS. 5, 6A-6D, 7A-7C, and 8A-8D show a method 500 for fabricating a sensor structure 300 that results in at least that portion of the stack structure shown in FIG. 4 according to an example embodiment. More specifically, FIG. 5 shows a flow chart of the method 500 that includes this process of fabricating magnetoresistive sensor assembly 304 with an improved reset mechanism in a stack configuration with the transistor assembly 302. Meanwhile, FIGS. 6A-6D, 7A-7C, and 8A-8D illustrate cross-sections of the sensor structure 300 at various stages of this process in accordance with the method 500 of FIG. 5. This method 500 is advantageous in monolithically integrating the magnetoresistive sensor assembly 304 with a flux guide reset operation with an improved configuration and reduced power supply that is in a stack configuration with the transistor assembly 302 on a single chip.

Figure 6A:
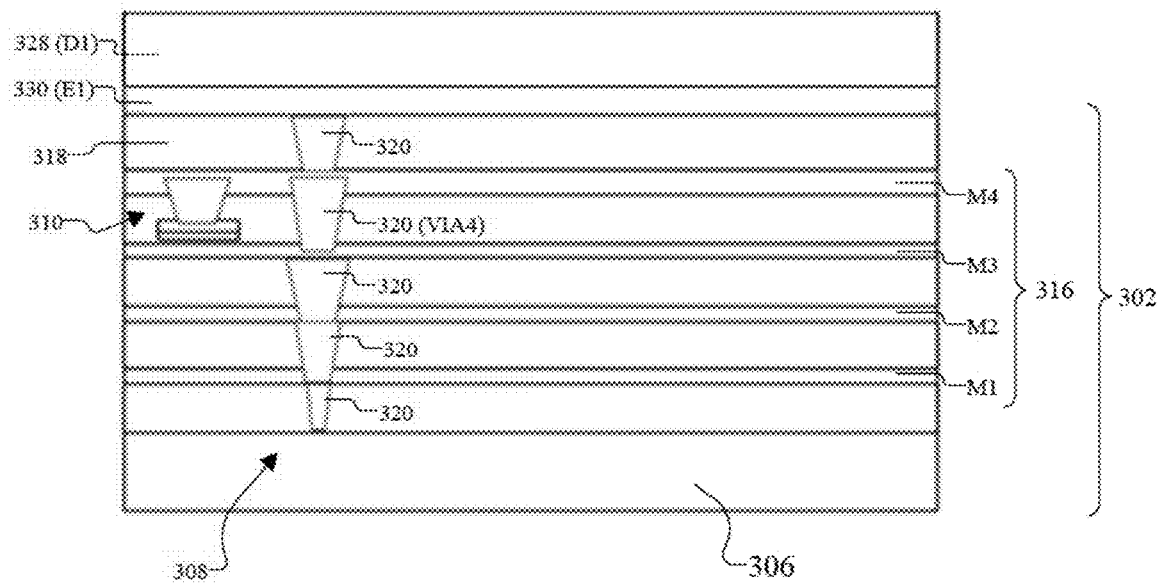
FIGS. 6A, 6B, 6C, and 6D are diagrams that show cross-sections of parts of the stack structure of the sensor structure during different stages of a process of fabricating the UTM module according to an example embodiment of this disclosure.

At step 502, the method 500 includes fabricating transistor technology. For example, in FIG. 6A, the method 500 includes fabricating the transistor assembly 302 with respect to a substrate 306. In FIG. 6A, the transistor assembly 302 includes at least one CMOS device 308 and at least one MIM device 310. For example, the method 500 includes fabricating a CMOS device 308 to include the plurality of metal layers 316. In addition, the method 500 may include fabricating at least one MIM device 310 within an insulation portion in which the plurality of metal layers 316 are disposed. Referring to FIG. 6A, for instance, the MIM device 310 is fabricated in an insulation portion that is between a pair of adjacent metal layers 316 at an upper portion of the CMOS assembly. In this case, the MIM device 310 is located between the third metal layer M3 and the fourth metal layer M4. The MIM device 310 is advantageously positioned to avoid interfering with at least one other component that may disrupt the operation of at least the MIM device 310.

At step 504, the method 500 includes fabricating the UTM module on the transistor assembly 302. FIGS. 6A-6D illustrate cross-sections of the sensor structure 300 during the process of fabricating UTM module. Upon fabricating and/or obtaining the transistor assembly 302 at a stage after the formation of the upper metal layer (M4) and the upper vertical interconnect (e.g., VIA5), the method 500 includes depositing a first etch stop layer 330 (E1) and a first dielectric layer 328 (D1) on the transistor assembly 302.

Figure 6B:
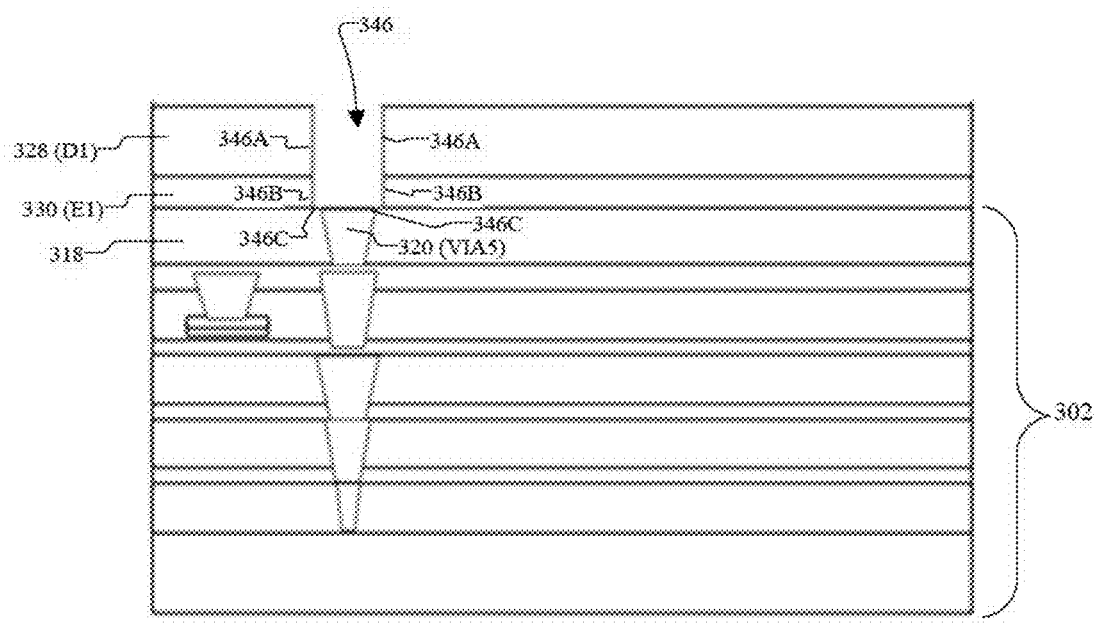

The method 500 includes using a UTM mask as a pattern to create a UTM coil 322 within the insulating layer. When the dielectric layer is shaped by the pattern of the UTM mask, the UTM coil 322 is shaped by the dielectric layer to have a coil shape in plan view, as shown, for example, in FIG. 2. In this regard, the UTM mask exposes a part of the first dielectric layer 328 (D1) that is to undergo etching to create a trench for the UTM coil 322 with at least one portion that is aligned to connect with the vertical interconnect 320 (VIA5) while protecting other areas of that first dielectric layer 328 (D1). More specifically, as shown in the cross-sectional view of FIG. 6B, the method 500 includes using the UTM mask to create a trench 346 in the first dielectric layer 328 (D1) while masking the non-trench regions of the first dielectric layer 328 (D1) during formation of the trench 346. Upon providing the UTM mask on the first dielectric layer 328 (D1), the method 500 includes forming the trench 346 by removing that corresponding part of the first dielectric layer 328 (D1) and that corresponding part of the first etch stop layer 330 (E1) while using the first etch stop layer 330 (E1) as a reference of when to stop etching. For example, as shown in FIG. 6B, the trench 346 is formed to an extent that the vertical interconnect 320 (VIA5) is exposed such that a part of the UTM coil 322, when formed, is enabled to connect to the CMOS device 308 by means of the vertical interconnect 320 (VIA5). Once formed, as shown in FIG. 6B, the trench 346 is defined by sidewalls 346A of the first dielectric layer 328 (D1), sidewalls 346B of the first etch stop layer 330 (E1), an upper surface portion 346C of the insulating layer 318, and an upper surface portion of the vertical interconnect 320 (VIA5).

Figure 6C:
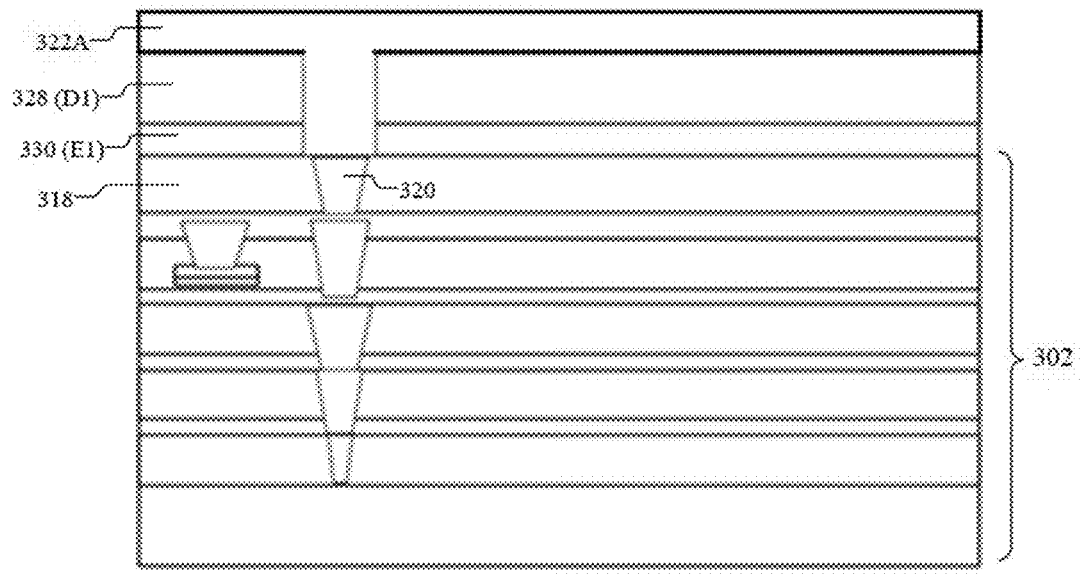
Figure 6D:
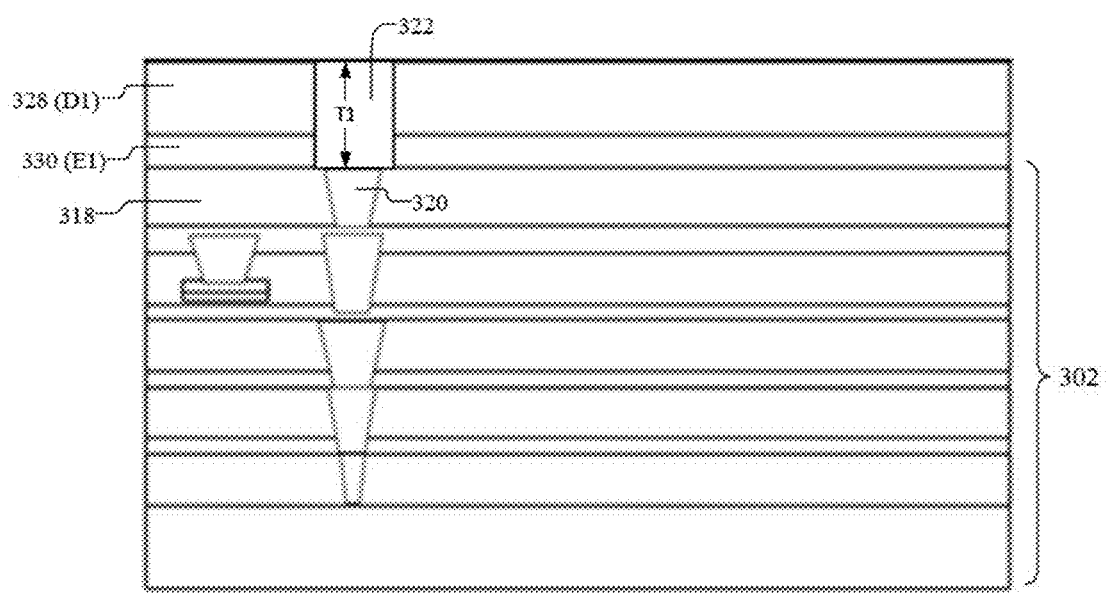

The method 500 includes forming a UTM layer 322A over the resulting structure (FIG. 6B) such that the UTM layer 322A fills at least the trench 346. In addition, the UTM layer 322A may be formed to cover an upper surface of the first dielectric layer 328 (D1), as shown in FIG. 6C. For instance, in FIG. 6C, the method 500 includes performing a damascene process to form the UTM layer 322A. The damascene process includes forming a copper layer by forming at least a barrier layer, a seed layer, a copper plate, and/or a copper alloy. The UTM layer 322A includes copper, a copper alloy, or any suitable conductive material that provides the functionality as discussed herein. After forming the UTM layer 322A, the method 500 includes forming the UTM coil 322 by removing the excess portion of the UTM layer 322A that coats an upper surface of the first dielectric layer 328 (D1). For example, the UTM layer 322A may be refined by a chemical mechanical polish (CMP) process to form the UTM coil 322 and the first dielectric layer 328 (D1) of predetermined thicknesses. In this regard, for example, the CMP process may include a copper CMP with tantalum (Ta) as an end point (EP) polish. More specifically, as shown in at least FIG. 6D, the CMP process may include removing a topical portion of the dielectric layer 328 (D1) such that the remaining portion of the UTM layer 322A forms the UTM coil 322. In an example embodiment, the UTM coil 322 has a thickness T1 that is equal to or substantially equal to one micrometer in accordance with fabrication tolerances. The thickness T1 may be adapted to be either greater or less than 1 um as the sensor design targets dictate. As discussed above, in FIG. 6D, the UTM coil 322 comprises copper. Also, the UTM coil 322 comprises a planar coil as defined by the trench 346 in plan view. In this case, the UTM coil 322 has a thickness that is equal to or substantially equal to a thickness of the first etch stop layer 330 (E1) and a thickness of the first dielectric layer 328 (D1). In addition, as the vertical interconnect (VIA5) is exposed at the bottom of the trench 346, the UTM coil 322 is configured to connect to the underlying metal and via layers and thus the CMOS device 308. This feature enables the UTM coil 322, which is configured as flux guide reset coil 208, to be responsive to the CMOS device 308.

Figure 7A:
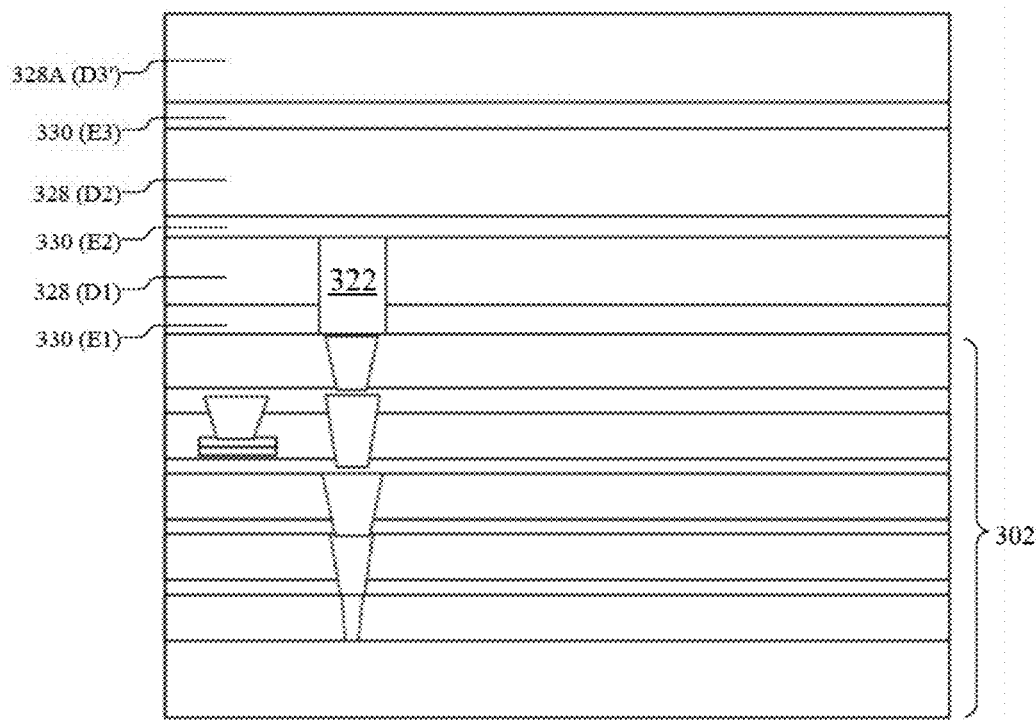
FIGS. 7A, 7B, and 7C are diagrams that show cross-sections of parts of the stack structure of the sensor structure during different stages of a process of fabricating a flux guide module according to an example embodiment of this disclosure.

At step 506, the method 500 includes forming a dielectric portion on the UTM module and the transistor assembly 302 on the substrate 306. Meanwhile, FIG. 7A illustrates a cross-section of the sensor structure 300 upon forming the dielectric portion. In this regard, for example, the method 500 includes depositing a second etch stop layer 330 (E2) on the resulting structure (FIG. 6D) that includes at least an upper surface of the UTM coil 322 and an upper surface of the dielectric layer 328 (D1). The second etch stop layer 330 (E2) may include a same thickness or substantially the same thickness as the first etch stop layer 330 (E1). In contrast, a thickness of the second dielectric layer 328 (D2) is smaller than a thickness of the first dielectric layer 328 (D1). Also, the method 500 includes depositing a third etch stop layer 330 (E3) on the second dielectric layer 328 (D2). A third dielectric layer 328 (D3') is then deposited on the third etch stop layer 330 (E3). The third etch stop layer 330 (E3) may include a same thickness or substantially the same thickness as the first etch stop layer 330 (E1) and/or the second etch stop layer 330 (E2). In this example, the third dielectric layer 328 (D3') is thicker than the second dielectric layer 328 (D2). The third dielectric layer 328 (D3') is configured to insulate the flux guide 312, the metal line 332, and the metal filling 332A. The metal filling 332A is a metal part. In this example, each etch stop layer 330 (E1, E2, and E3) comprises silicon nitride or any suitable material. Also, each dielectric layer 328 (D1, D2, D3', and D3) comprises tetraethoxysilane (TEOS) or any suitable material.

At step 508, the method 500 includes fabricating the flux guide 312 with respect to the UTM module and the transistor assembly 302 on the substrate 306. In this regard, FIGS. 7B-7C are cross-sections of the sensor structure 300 during the process of fabricating the flux guide 312.

More specifically, upon forming the second etch stop layer 330 (E2), the second dielectric layer 328 (D2), the third etch stop layer 330 (E3), and the third dielectric layer (D3') over the UTM coil 322 and the first dielectric layer 328 (D1) at step 506, the method 500 includes depositing a flux guide mask on the third dielectric layer 328 (D3). The flux guide mask is generated and applied to enable a trench 348 to be formed of an appropriate size and position relative to other components while protecting these other components during formation of the trench 348. The flux guide mask exposes a trench region of the third dielectric layer 328A (D3') at a suitable position while protecting the non-trench regions of the third dielectric layer 328A (D3'). Upon placing the flux guide mask on the third dielectric layer 328A (D3'), the method 500 includes forming the trench 348 by removing the corresponding part of the third dielectric layer 328A (D3'), the corresponding part of the third etch stop layer 330 (E3), and an upper portion of the second dielectric layer 328 (D2). As shown in FIG. 7B, the trench 348 is formed to extend from the upper surface of the third dielectric layer 328A (D3') to an intermediary part of the second dielectric layer 328 (D2) while extending entirely through the third dielectric layer 328A (D3') and the third etch stop layer 330 (E3). In this case, as shown in at least FIG. 7B, the trench 348 may be tapered to be wider at the third dielectric layer 330 (D3') than at the second dielectric layer 330 (D2). In other words, the trench 348 may be narrower at the second dielectric layer 330 (D2) than the third dielectric layer 330 (D3').

Once the trench 348 is formed, the method 500 includes forming the flux guide 312. For example, the flux guide 312 can be formed by depositing an alloy layer 312A over the resulting structure such that the trench 348 has its bottom surface 348A and sidewalls 348B of the second dielectric layer 328 (D2), sidewalls 348C of the third etch stop layer 330 (E3), and sidewalls 348D of the third dielectric layer 328 (D3') lined with the alloy layer 312A. In this regard, the flux guide 312 is formed by sputter deposition, electroplating, electroless plating, any suitable method, or any suitable combination thereof. The flux guides 312 are shaped as a bar or other guide geometries placed upon surfaces of or within the sensor structure.

Figure 7B:
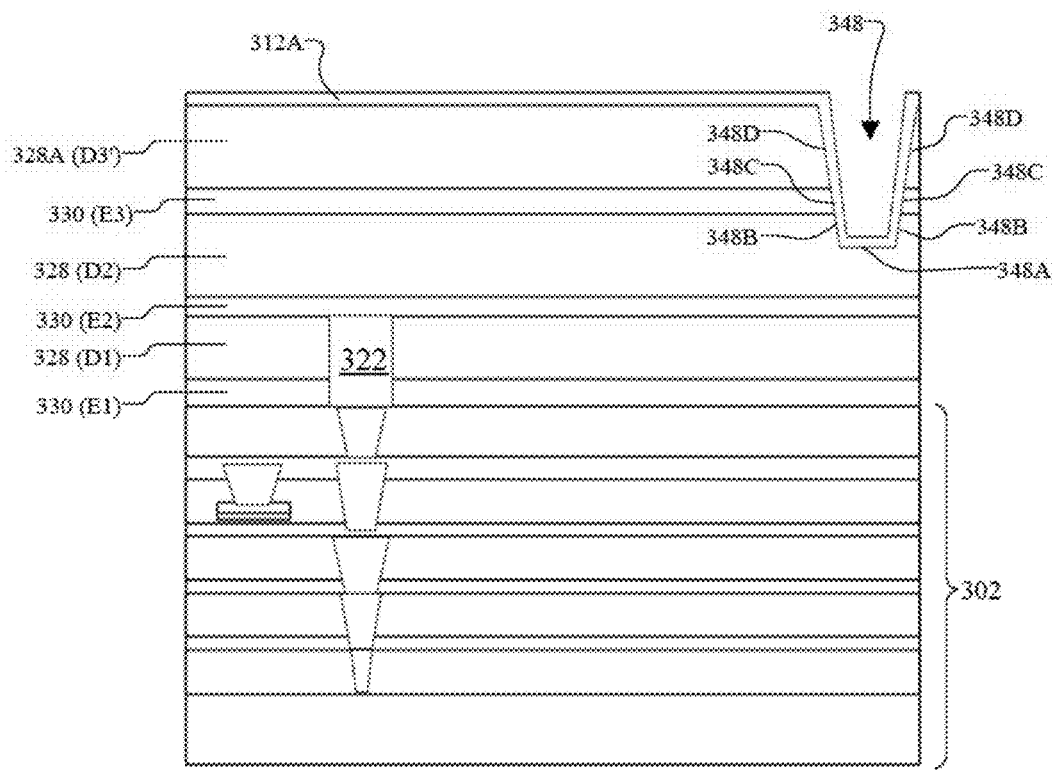
Figure 7C:
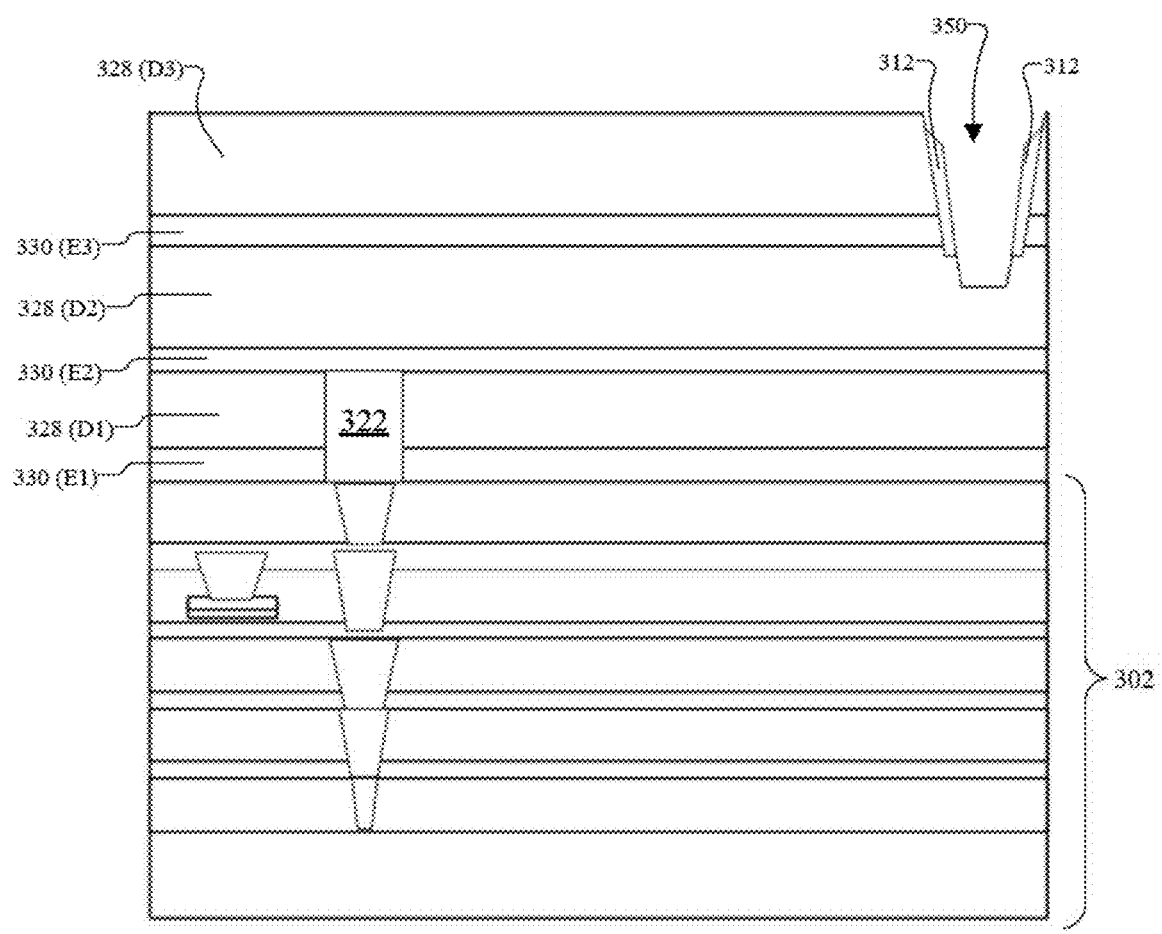

Referring to FIG. 7B, as an example, the alloy layer 312A includes a nickel-iron (NiFe) alloy lining or any suitable ferromagnetic lining on sidewalls 348B, 348C, and 348D of the trench 348. As shown in FIG. 7B, the flux guide 312 is oriented mostly vertically along the sidewalls 348B, 348C, and 348D of the trench 348. For example, this alloy lining is generally formed to be around 1 micrometer in accordance with fabrication tolerances, but may be less than 1 micrometer or greater than 1 micrometer. Also, in this example, as shown in FIG. 7C, the method 500 includes performing a sputtering process to etch away the nickel-iron alloy layer 312A on the upper surface of the third dielectric layer 328A (D3') and the bottom surface 348A of the trench 348. The sputtering process includes argon or any suitable element or elements to perform the etching. Next, the method 500 includes providing an additional dielectric deposit over the third dielectric layer 328A (D3') to form the dielectric layer 328 (D3) of a predetermined thickness.

Figure 8A:
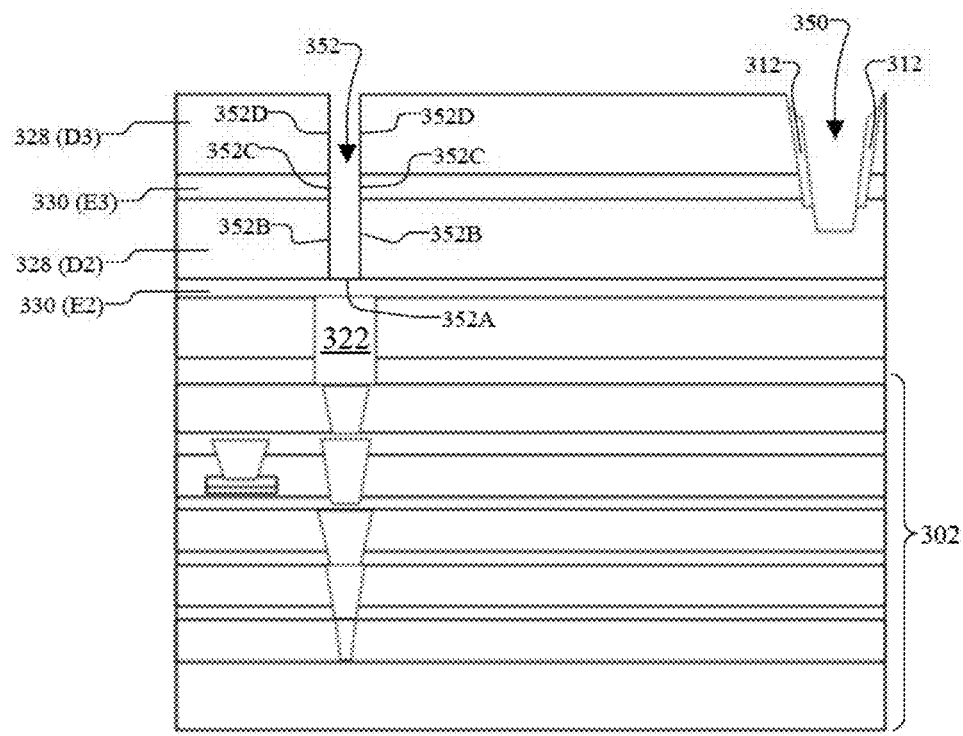
FIGS. 8A, 8B, 8C, and 8D are diagrams that show cross-sections of parts of the stack structure of the sensor structure during different stages of a process of fabricating connections between the UTM module and the metal line according to an example embodiment of this disclosure.
Figure 8B:
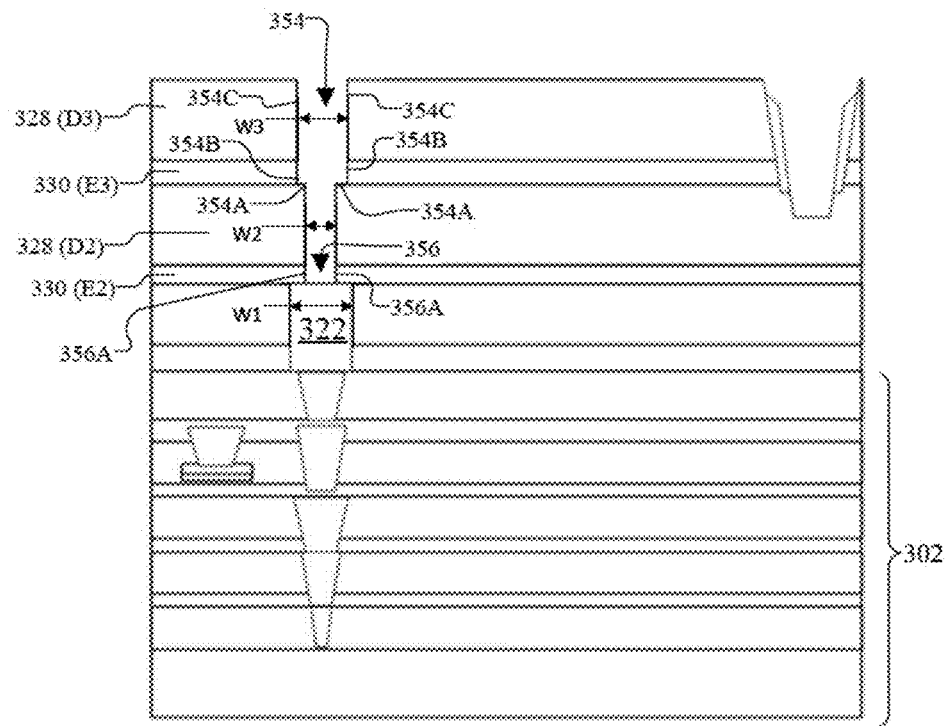

In addition, the method 500 includes fabricating at least one electrical connection between the UTM module and the metal line 332. FIGS. 8A-8D illustrate cross-sections of the sensor structure 300 during various stages of the process of establishing at least one connection between the UTM coil 322 and the metal line 332. In this regard, the method 500 includes forming a via hole 352 that extends from an upper surface of the third dielectric layer 328 (D3) to an upper surface of the second etch stop layer 330 (E2). In this case, the via hole 352 is formed by using a mask, which exposes the desired region that is aligned with the UTM coil 322 while protecting other neighboring regions. The method 500 includes using the mask to remove corresponding portions of the stack from an upper surface of the third dielectric layer 328 (D3) to an upper surface 352A of the second etch stop layer 330 (E2). In this case, the etching is performed on corresponding part 352D of the third dielectric layer 328 (D3), corresponding part 352C of the third etch stop layer 330 (E3), and corresponding part 352B of the second dielectric layer 328 (D2). In an example, the etching is performed such that the via hole 352 comprises a uniform width for each of these layers. As shown in FIGS. 8A and 8B, this via hole 352 has a width W2 taken at the second dielectric layer 328 (D2) (or width W2 taken at the second etch stop layer 330 (E2)) that is less than a width W1 of the UTM coil 322 as the via hole 352 is structured to shape and define the vertical interconnect 326, which serves as an electrical connection between the UTM coil 322 and the metal line 332.

The method 500 includes fabricating a trench 354 for the metal line 332 that connects to the via hole 352. The trench 354 is formed with a mask. The mask enables the formation of the trench 354 to be aligned with the via hole 352 and the UTM coil 322. The method 500 includes etching corresponding parts of the third dielectric layer 328 (D3) and the third etch stop layer 330 (E3) to form the trench 354 in these layers. The etching is performed by using third etch stop layer 330 (E3) as a reference. The trench 354 is defined by upper surface portions 354A of the second dielectric layer 328 (D2), sidewalls 354B of the third etch stop layer 330 (E3), and sidewalls 354C of the third dielectric layer 328 (D3).

The method 500 includes forming a via hole 356 by removing a corresponding part of the second etch stop layer 330 (E2) having a width W2. The via hole 356 is formed to expose an upper surface 354A of the UTM coil 322, thereby uniting the via hole 356 with the via hole 352 to define a space for the fabrication of the vertical interconnect 326. In this example, the width W3 of the trench 354 for the metal line 332 is greater than the width W2 of the via hole 352/356 for the vertical interconnect 326 such that the width of the metal line 332 is greater than the width of the vertical interconnect 326. In addition, the width W3 of the trench for the metal line 332 may be less than or equal to the width W1 of the trench 346 (or the width W1 of the UTM coil 322) within fabrication tolerances.

Figure 8C:
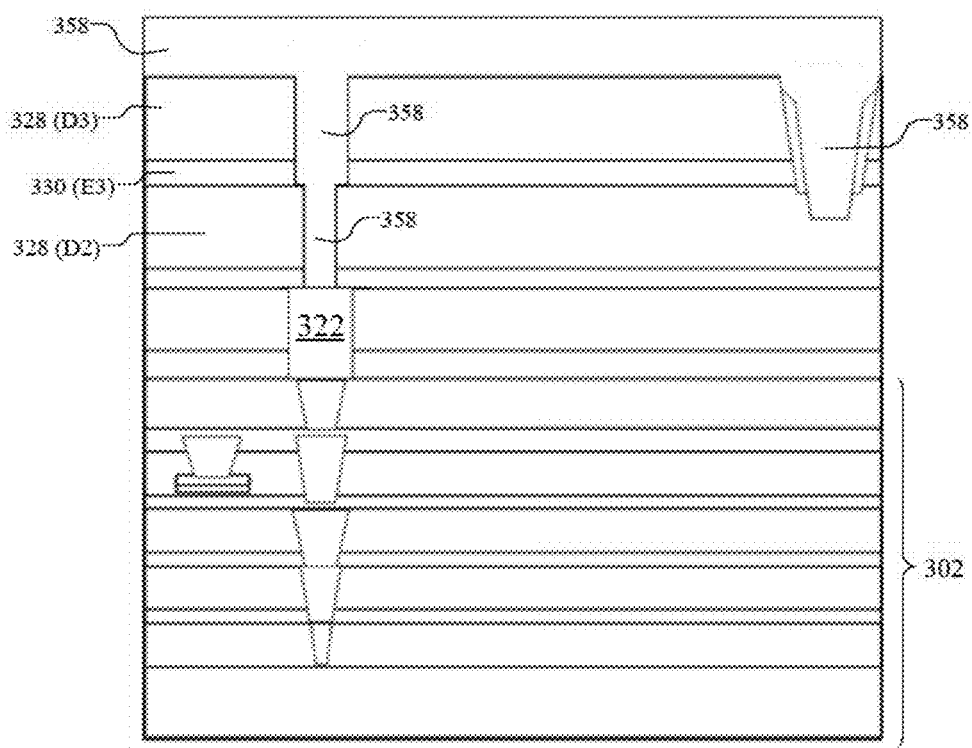
Figure 8D:
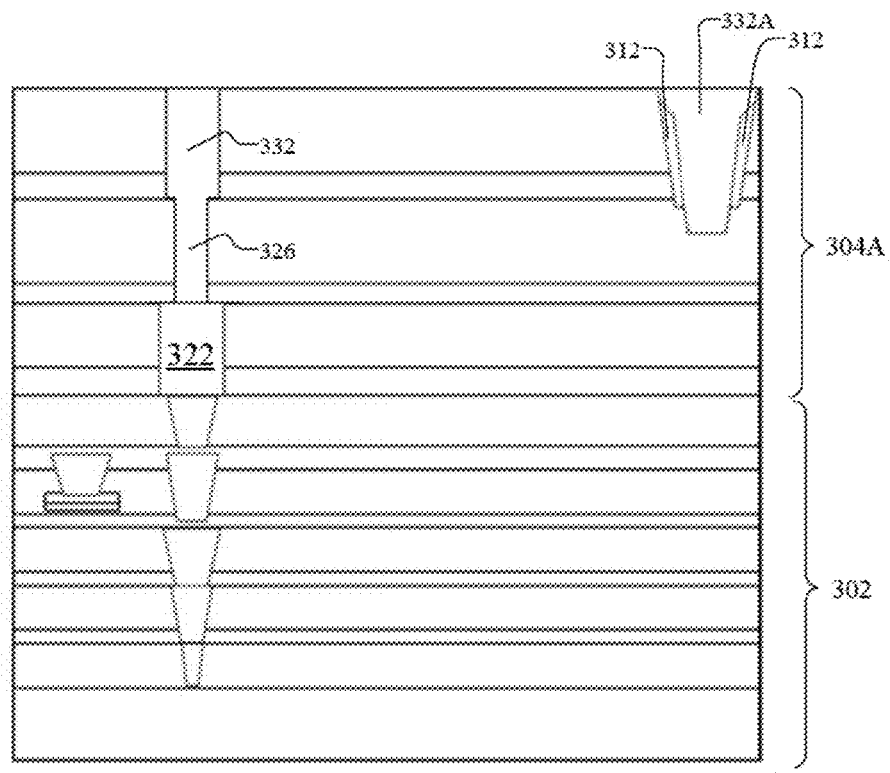

The method 500 further includes forming the vertical interconnect 326, the metal line 332, and the metal filling 332A for the flux guide 312. In this example, the method 500 includes performing a damascene process or a dual damascene process to form the metal formation 358 that provides the vertical interconnect 326, the metal line 332, and the metal filling 332A for the flux guide 312. The damascene process or dual damascene process includes forming a barrier layer, a seed layer, a copper plate, a copper alloy, any other damascene step, or any combination thereof. As shown in FIGS. 8C and 8D, for instance, the method 500 includes forming the vertical interconnect 326, the metal line 332, and the metal filling 332A for the flux guide 312 by the same damascene or dual damascene process. More specifically, as shown in at least FIGS. 8B and 8D, the vertical interconnect 326 is formed within a region, which is bounded or defined by an upper surface of the UTM coil 322, sidewalls 356A of the second etch stop layer 330 (E2), and sidewalls 352B of the second dielectric layer 328 (D2). Also, the metal line 332 is formed within a region, which is bounded or defined by sidewalls 354C of the third dielectric layer 330 (D3), the sidewalls 354B of the third etch stop layer 330 (E3), upper surface portions 354A of the second dielectric layer 330 (D2), and an upper surface of the vertical interconnect 326. In addition, the metal filling 332A for the flux guide 312 is formed within a region, which corresponds to trench 350 and which is bounded or defined by wall portions of the third dielectric layer 328 (D3), wall portions of the flux guide 312, and wall portions of the second dielectric layer 328 (D2). In this regard, the method 500 includes providing this metal formation 358 such that at least each of these regions are filled to form the vertical interconnect 326, the metal line 332, and the metal filling 332A for the flux guide 311. In addition to filling the corresponding trenches for these components, the metal formation 358 also covers the stack such that the metal formation 358 provides a blanket over at least the third dielectric layer 328 by a predetermined amount.

Furthermore, as shown in FIG. 8D, the method 500 includes performing a CMP process to remove the excess amount of metal formation 358 from the stack such that the metal line 332 and the metal filling 332A are fabricated to predetermined thicknesses, respectively. As shown, the thickness of the metal filling 332A is thicker than the metal line 332 as the depth of the trench 350 is greater than the depth of the trench 354. After the CMP process is performed, the stack is provided with the vertical interconnect 326, the metal line 332, and the metal filling 332A. In this example, the metal formation 358 comprises copper such that each of the vertical interconnect 326, the metal line 332, and the metal filling 332A comprise copper or any comparable metal or material.

At step 510, the method 500 includes continuing to fabricate the remaining second portion 304B of the magnetoresistive sensor assembly 304, as shown in FIG. 4, to produce at least the portion of the sensor structure 300, as shown in FIG. 3. In this regard, after step 508, then the method 500 is configured to carry out standard processes associated with forming the second portion 304B of the magnetoresistive sensor assembly 304 to create the sensor structure 300. For example, the method 500 further includes forming the upper metal interconnect element 324 and configuring the upper metal interconnect element 324 as the sensing element reset coil 210 (FIG. 2) after forming various features (e.g., magneto-resistive magnetic sensing layers, dielectric layers, interconnects, etc.) over the flux guide 312 and the sensing element 314.

As discussed herein, the embodiments include a number of advantageous features, as well as benefits. For example, the embodiments provide an improved configuration and fabrication process for forming a magnetic field sensor that is responsive to an applied magnetic field in three dimensions and that is enabled to perform reset operations with relatively low voltage requirements to ensure proper functioning thereof. The embodiments are also advantageous in providing magnetic field sensors, which are constructed efficiently and inexpensively together with integrated circuit structures (e.g., transistor assembly 302) while providing a stable output that is resistant to external field shocks and while being compatible for use in mobile applications, electronic compass applications, other suitable applications, or any combination thereof. In this regard, the embodiments are configured to consume less battery power and sustain a longer battery life, for example, in mobile applications.

Furthermore, the embodiments integrate low resistance UTM coils 322 that comprise copper into transistor assemblies 302 after forming the CMOS devices 308 and before forming the magnetic flux guides 312 to provide monolithic three-dimensional sensing units as stacks on single chips. With these integration processes, the embodiments enable components to be closer in proximity and enable reset operations to occur with lower currents when needed, for example, such as in the event of magnetic field over exposure. In addition, these lower currents enable lower charge dissipation, thereby enabling lower reset power, smaller reset capacitor, smaller chip size, and higher interconnect resistances.

Advantageously, the embodiments have reset mechanisms, which are advantageously configured with UTM coils 322 comprising copper as one of its reset components. By using copper UTM coils 322 as first reset components, the embodiments are enabled to position these first reset components closer in distance to the flux guide 312 (e.g., 40% closer compared to other configurations involving reset components comprising aluminum) In addition, these embodiments provide the flux guides 312 with reset mechanisms in which a thickness of a selected copper UTM coil 322 can be about one micrometer in accordance with fabrication tolerances. By fabricating the UTM coils 322 to comprise copper, the UTM coils 322 lessen the overall heights of the stacks in the vertical direction. These embodiments provide finer UTM coils 322 with minimal design rules (MDR) that provide configurations with efficient routing and spacing options, thereby enabling compact and tight density configurations.

That is, the above description is intended to be illustrative, and not restrictive, and provided in the context of a particular application and its requirements. Those skilled in the art can appreciate from the foregoing description that the present invention may be implemented in a variety of forms, and that the various embodiments may be implemented alone or in combination. Therefore, while the embodiments of the present invention have been described in connection with particular examples thereof, the general principles defined herein may be applied to other embodiments and applications without departing from the spirit and scope of the described embodiments, and the true scope of the embodiments and/or methods of the present invention are not limited to the embodiments shown and described, since various modifications will become apparent to the skilled practitioner upon a study of the drawings, specification, and following claims. For example, components and functionality may be separated or combined differently than in the manner of the various described embodiments, and may be described using different terminology. These and other variations, modifications, additions, and improvements may fall within the scope of the disclosure as defined in the claims that follow.

What is claimed is:

1. A method for fabricating a magnetic sensor device that is enabled to magnetize a flux guide to a predetermined magnetic orientation, the method comprising:
   depositing a dielectric layer on a transistor assembly;
   forming a first trench in the dielectric layer, the first trench at least partially exposing a first interconnect that is connected to the transistor assembly;

depositing a diffusion barrier layer on at least sidewalls of the dielectric layer that define the first trench;
forming an ultra thick metal (UTM) layer on the diffusion barrier layer to fabricate a first metal coil within the first trench;
depositing an intermediary dielectric layer;
depositing another dielectric layer on the first metal coil, the another dielectric layer being formed after the intermediate dielectric layer such that the intermediary dielectric layer is between the dielectric layer and the another dielectric layer;
forming the flux guide in the another dielectric layer;
removing a portion of the intermediary dielectric layer to form a second trench for a second interconnect, the second trench at least partially exposing the first metal coil; and
performing a damascene process with copper to form the second interconnect, the metal line, and a metal part that is in contact with the flux guide, and
forming a second metal coil over the another dielectric layer,
wherein,
   the metal line is formed in the another dielectric layer after the flux guide is formed,
   the second interconnect operably connects the first metal coil to the metal line,
   the flux guide is formed in the another dielectric layer before the second trench is formed in the intermediary dielectric layer, and
   the first metal coil and the second metal coil are configured as a reset mechanism that is configured to be responsive to the transistor assembly to magnetize or demagnetize the flux guide to the predetermined magnetic orientation.

2. The method of claim 1, further comprising:
performing a damascene process with copper to form the UTM layer,
wherein the first metal coil is fabricated such that the reset mechanism is configured to perform a reset operation using voltage that is less than 5 volts.

3. The method of claim 1, wherein:
the first metal coil comprises copper; and
the first metal coil has a thickness of less than two micrometers.

4. The method of claim 1, further comprising:
forming a magnetoresistive sensor on the transistor assembly with the first metal coil being between the magnetoresistive sensor and the transistor assembly in a stack on a substrate.

5. The method of claim 1, further comprising:
forming a third trench in the another dielectric layer and a part of the intermediary dielectric layer;
fabricating the flux guide by depositing a ferromagnetic layer on first sidewall portions of the another dielectric layer and second sidewall portions of the intermediary dielectric layer that define the third trench; and
forming a fourth trench in the another dielectric layer, the fourth trench at least partially exposing the second trench,
wherein the metal line is formed in the fourth trench.

6. A method for integrating a magnetoresistive sensor assembly with a transistor assembly on a chip, the method comprising:
forming the transistor assembly on a substrate, the transistor assembly including at least a semiconductor device and a first interconnect, the first interconnect being operably connected to the semiconductor device;
depositing a dielectric layer on the transistor assembly;
removing portions of the dielectric layer to form a first trench that at least partially exposes the first interconnect;
performing a damascene process to form an ultra thick metal (UTM) layer within the first trench to create a first metal coil, the first metal coil being configured as a first reset component;
depositing an intermediary dielectric layer;
depositing another dielectric layer on the first metal coil, the another dielectric layer being formed after the intermediary dielectric layer such that the intermediary dielectric layer is between the dielectric layer and the another dielectric layer;
forming a flux guide within the another dielectric layer;
removing a portion of the intermediary dielectric layer to form a second trench for a second interconnect, the second trench at least partially exposing the first metal coil;
removing a portion of the another dielectric layer to form a third trench for a metal line; and
performing another damascene process with copper to form the second interconnect, the metal line, and a metal part that is in contact with the flux guide, and
forming a second metal coil on the another dielectric layer, the second metal coil being configured as a second reset component,
wherein,
   the second interconnect operably connects the first metal coil to the metal line, and
   the first reset component and the second reset component are configured as a reset mechanism that is configured to be responsive to the transistor assembly and operable to magnetize or demagnetize the flux guide to a predetermined magnetic orientation.

7. The method of claim 6, wherein the UTM layer comprises copper.

8. The method of claim 6, further comprising:
polishing the UTM layer to form the first metal coil having a thickness that is not greater than two micrometers.

9. The method of claim 6, wherein the reset mechanism is configured to perform a reset operation to reset the flux guide to the predetermined magnetic orientation using voltage that is less than 5 volts.

10. The method of claim 6,
wherein the flux guide is also formed along sidewall portions of the intermediary dielectric layer such that a thickness of the intermediary dielectric layer between the flux guide and the first metal coil is less than 0.5 micrometers.

11. The method of claim 6, wherein the transistor assembly includes a magneto resistive device within an insulating portion.

12. A method for fabricating a sensor structure that includes a complementary metal-oxide-semiconductor (CMOS) device and a magnetoresistive sensor device with a reset operation for a flux guide, the method comprising:
depositing a dielectric layer on the CMOS device;
forming a first trench in the dielectric layer, the first trench forming a coil shape in the dielectric layer in plan view;
forming an ultra thick metal (UTM) layer within the first trench of the dielectric layer to fabricate a first metal coil, the first metal coil being configured as a first reset component;
depositing an intermediary dielectric layer on the first metal coil;

depositing another dielectric layer on the first metal coil;

forming the flux guide along at least sidewall portions of the another dielectric layer; and forming a second metal coil on the another dielectric layer such that the flux guide is between the first metal coil and the second metal coil, the second metal coil being configured as a second reset component, wherein, a thickness of the intermediary dielectric layer between the flux guide and the first metal coil is less than 0.5 micrometers, and the first reset component and the second reset component are configured as a reset mechanism, the reset mechanism being configured to perform the reset operation to orient the flux guide to a predetermined orientation using voltage that is less than 5 volts.

13. The method of claim 12, further comprising:

performing a damascene process with copper to form a UTM layer; and polishing the UTM layer to form the first metal coil with a thickness of that is not greater than two micrometers.

14. The method of claim 12, further comprising:

forming a magneto resistive device within an insulating portion associated with the CMOS device, the insulating portion including a metal layer and an interconnect, the interconnect being operably connected to the first metal coil, wherein the dielectric layer is deposited on the magneto resistive device.

15. The method of claim 12, further comprising:

removing a portion of the intermediary dielectric layer to form a second trench for a second interconnect, the second trench at least partially exposing the first metal coil;

removing another portion of the another dielectric layer to form another trench for a metal line; and performing a damascene process with copper to form the second interconnect, the metal line, and a metal part that is in contact with the flux guide, wherein, the intermediary dielectric layer is deposited before the another dielectric layer such that the intermediary dielectric layer is disposed between the dielectric layer and the another dielectric layer, and the second interconnect operably connects the first metal coil to the metal line.

16. The method of claim 15, wherein the flux guide is formed in the another dielectric layer before the second trench is formed in the intermediary dielectric layer.

* * * * *